(12) United States Patent
Hennig et al.

(10) Patent No.: US 10,910,550 B2
(45) Date of Patent: Feb. 2, 2021

(54) PIEZOCERAMIC MATERIAL WITH REDUCED LEAD CONTENT

(71) Applicant: PI CERAMIC GMBH, Lederhose (DE)

(72) Inventors: Eberhard Hennig, Mörsdorf (DE); Antje Kynast, Leipzig (DE); Michael Töpfer, Arnstadt (DE); Michael Hofmann, Neustade an der Orla (DE)

(73) Assignee: PI CERAMIC GMBH, Lederhose (DE)

( * ) Notice: Subject to any disclaimer, the term of this patent is extended or adjusted under 35 U.S.C. 154(b) by 0 days.

(21) Appl. No.: 14/909,786

(22) PCT Filed: Aug. 7, 2014

(86) PCT No.: PCT/EP2014/067036
§ 371 (c)(1),
(2) Date: Feb. 3, 2016

(87) PCT Pub. No.: WO2015/018915
PCT Pub. Date: Feb. 12, 2015

(65) Prior Publication Data
US 2016/0190430 A1 Jun. 30, 2016

(30) Foreign Application Priority Data

Aug. 7, 2013 (DE) .................. 10 2013 013 182
Aug. 7, 2014 (DE) .................. 10 2014 111 285

(51) Int. Cl.
*H01L 41/187* (2006.01)
*H01L 41/18* (2006.01)
(Continued)

(52) U.S. Cl.
CPC ........ *H01L 41/1873* (2013.01); *C04B 35/495* (2013.01); *C04B 35/62655* (2013.01);
(Continued)

(58) Field of Classification Search
CPC . H01L 41/1873; H01L 41/0805; H01L 41/18; H01L 41/187; C04B 2235/3201;
(Continued)

(56) References Cited

U.S. PATENT DOCUMENTS

| | | | |
|---|---|---|---|
| 7,449,077 B2 | 11/2008 | Heinzmann et al. | 156/89.12 |
| 2007/0152183 A1* | 7/2007 | Furukawa | C04B 35/495 |
| | | | 252/62.9 R |

(Continued)

FOREIGN PATENT DOCUMENTS

| | | | | |
|---|---|---|---|---|
| DE | 10 234 787 | 10/2003 | .......... | H01L 41/047 |
| DE | 10 2007 013 874 | 10/2007 | .......... | C04B 35/01 |

(Continued)

OTHER PUBLICATIONS

English translation of the International Preliminary Report on Patentability (Chapter II of the Patent Cooperation Treaty), dated Jan. 4, 2016, the International Preliminary Report on Patentability (Chapter II of the Patent Cooperation Treaty), in German, dated Sep. 15, 2015, the Written Opinion of the International Searching Authority, in German, dated Oct. 21, 2014, and the International Search Report, in English, dated Oct. 21, 2014, which were issued by the International Bureau of WIPO in Applicant's corresponding international PCT application having Serial No. PCT/EP2014/067036, filed on Aug. 7, 2014.

(Continued)

*Primary Examiner* — Matthew E. Hoban
*Assistant Examiner* — Lynne Edmondson
(74) *Attorney, Agent, or Firm* — Bodner & O'Rourke, LLP; Gerald T. Bodner; Christian P. Bodner

(57) ABSTRACT

The invention relates to a piezoceramic material with reduced lead content, based on potassium sodium niobate (PSN) and having a defined parent composition. According to the invention the manner of addition of a mixture of Pb, (Continued)

Nb and optionally Ag and optionally Mn gives a wide sintering range together with reproducible electrical and mechanical properties of the material.

13 Claims, 5 Drawing Sheets

(51) Int. Cl.
*C04B 35/495* (2006.01)
*C04B 35/626* (2006.01)
*H01L 41/43* (2013.01)

(52) U.S. Cl.
CPC ........ *C04B 35/62695* (2013.01); *H01L 41/43* (2013.01); *C04B 2235/3201* (2013.01); *C04B 2235/3203* (2013.01); *C04B 2235/3251* (2013.01); *C04B 2235/3262* (2013.01); *C04B 2235/3291* (2013.01); *C04B 2235/3294* (2013.01); *C04B 2235/3296* (2013.01); *C04B 2235/72* (2013.01); *C04B 2235/725* (2013.01); *C04B 2235/768* (2013.01); *C04B 2235/79* (2013.01)

(58) Field of Classification Search
CPC ...... C04B 2235/768; C04B 2235/3251; C04B 2235/3255; C04B 2235/80; C04B 2235/3267; C04B 35/495; C04B 35/62695
USPC ....... 252/62.9 R, 62.9 PZ; 310/358; 510/134
See application file for complete search history.

(56) References Cited

U.S. PATENT DOCUMENTS

| | | | |
|---|---|---|---|
| 2007/0176516 A1* | 8/2007 | Nagaya | C04B 35/493 310/346 |
| 2007/0216264 A1 | 9/2007 | Furukawa et al. | 310/366 |
| 2008/0199730 A1* | 8/2008 | Sato | C01G 9/006 428/697 |
| 2008/0290316 A1 | 11/2008 | Katayama et al. | 252/62.9 PZ |

FOREIGN PATENT DOCUMENTS

| | | | | |
|---|---|---|---|---|
| DE | 11 2006 003 755 | 6/2011 | ............. | C04B 35/00 |
| DE | 10 2010 041 567 | 3/2012 | ............. | C04B 35/01 |
| EP | 1 382 588 | 1/2004 | ........... | C04B 35/495 |
| EP | 1 702 906 | 9/2006 | ............. | C04B 35/00 |
| EP | 1 876 155 | 1/2008 | ............. | C04B 35/00 |
| EP | 1 876 156 | 1/2008 | ............. | C04B 35/00 |
| EP | 2 104 152 | 9/2009 | ............. | C04B 35/00 |

OTHER PUBLICATIONS

Mgbemere, et al., "Structural Phase Transitions and Electrical Properties of $(K_xNa_{1-x})NbO_3$-Based Ceramics Modified with Mn", Journal of the European Ceramic Society, vol. 32, No. 16, Dec. 1, 2012, pp. 4341-4352, XP055141371.

Won Ahn Chang, et al., "Effect of Ta Content on the Phase Transition and Piezoelectric Properties of Lead-free $(K_{0.4x}Na_{0.4x}Li_{0.04})(Nb_{0.995-x}Mn_{0.005}Ta_x)O_3$ Thin Film", Journal of Applied Physics, American Institute of Physics, vol. 111, No. 2, Jan. 15, 2012, pp. 24110-24110, XP012158003.

Acker, et al., "Influence of Alkaline and Niobium Excess on Sintering and Microstructure of Sodium-Potassium Niobate $(K_{0.5}Na_{0.5})NbO_3$", Journal of the American Ceramic Society, vol. 93, No. 5, Feb. 2010, p. 1270, XP055141373.

Saito, et al., "Lead-Free Piezoceramics", Nature, Nature Publishing Group, United Kingdom, vol. 432, No. 7013, Nov. 4, 2004, pp. 84-87.

Li, et al., "(K, Na)NbO$_3$-Based Lead-Free Piezoceramics: Fundamental Aspects, Processing Technologies, and Remaining Challenges", Journal of the American Ceramics Society, vol. 96, Issue 12, Dec. 2013, pp. 3677-3696.

Pang, et al., "(K, Na) NbO$_3$-based Lead-Free Piezoelectric Ceramics Manufactured by Two-Step Sintering", Ceramics International, vol. 38, Issue 3, Apr. 2012, pp. 2521-2527.

* cited by examiner

PIEZOCERAMIC MATERIAL WITH REDUCED LEAD CONTENT

The invention relates to a piezoceramic material with reduced lead content, based on potassium sodium niobate (PSN) of a basic composition according to the preamble of claim 1.

The current prior art in the production of piezoceramic materials is characterized by a radical change with respect to the desired switch to lead-free or lead-reduced products. As a result, measures for reducing the use of especially hazardous substances such as a lead in electrical and electronic devices is demanded in the Directive 2011/65/EU (RoHS2). Accordingly, substances with a lead content of greater than 0.1% by weight in the homogeneous material are subject to limitations for example and may only be marketed with special approval. Alternatives to the starting materials which are more environmentally friendly must still show the same performance features and similar parameters as the current lead-containing variants. Currently, lead zirconate titanate (PZT) is the base piezoceramic material that is used most frequently when rapidly switching piezoelectric applications in the motor vehicle area or sensors are concerned.

It was already proposed to replace PZT by potassium sodium niobate (PSN). Especially the complex modification of the PSN materials with lithium, tantalum and antimony ("Lead-free piezoceramics", Saito et al.; Letters to Nature, 2004) has the potential to represent alternatives to PZT.

EP1382588A1 thus describes a lead-free piezoceramic composition with a main component of the general formula $\{Li_x(K_{1-y}Na_y)_{1-x}\}(Nb_{1-z-w}Ta_zSb_w)O_3$ and at least one metallic element selected from (1) palladium, silver, gold, ruthenium, rhodium, rhenium, osmium, iridium and platinum, or (2) nickel, iron, manganese, copper, zinc, or (3) magnesium, calcium, strontium and barium as the additional element.

DE 102007013874A1 describes a multilayer piezoelectric element which comprises a plurality of lead-free piezoelectric layers, which contain an oxide having an alkali metal element especially in form of sodium, potassium or lithium and containing niobium or bismuth.

EP2104152A2 describes a piezoelectric element which contains a lead-free piezoelectric ceramic. The components $KNbO_3$ and $BaTiO_3$ are mentioned as the main components of the piezoelectric ceramic. The piezoelectric ceramics have the general formula $xKNbO_3-(1-x)BaTiO_3$, wherein x lies between 0.5 and 0.9.

Despite intensive research and development in the past 10 years it has not been possible until now to produce these promising lead-free materials on an industrial scale. The critical moment has proven to be that the desired properties are only achieved in a very narrow sintering interval of 10 to 20 K. Different approaches are described in the prior art to solve this problem. On the one hand, the sintering behaviour is to be improved in particular by further (lead-free) additions.

EP1876155A1, EP1876156A1 and DE112006003755B4 are aimed at broadening the sintering interval of a PSN material on the basis of (K1-a-bNaaLib)m(Nb1-c-dTacSbd)O3 with 0≤a≤0.9, 0≤b≤0.3, 0≤a+b≤0.9, 0≤c≤0.5, 0≤d≤0.1, 0.75≤m≤1.3 by adding perovskite oxides or oxide complexes and further oxides.

EP 1702906A1 describes a piezoceramic material, in which a ceramic basic composition is modified by the addition of alkaline earth metal niobate for example.

On the other hand, alternative sintering methods such as hot pressing, spark plasma sintering (Li et al.; J. Am. Ceram. Soc., 96 [12] 3677-3696 (2013)) or two-step sintering with heating rates of 10 K/min (Pang et al.; Ceramics International, 38 (2012) 2521-2527) have been proposed. These methods are not suitable for cost-effective mass production or cannot be implemented on an industrial scale due to the thermal inertia of great sintering volumes.

It is therefore an object of the invention, based on the above information, to provide a piezoceramic material on the basis of potassium sodium niobate (PSN), which in combination with reduced lead content has a sufficiently great expansion for the application in the region of the multilayer actuators and which has a broad sintering interval which in comparison with known lead-free PSN-based materials can be handled well on an industrial scale and therefore can be processed with conventional sintering methods.

The object of the invention is achieved by a piezoceramic material according to the combination of features according to claim 1, and a method for producing such a material according to claim 12. A piezoelectric multilayer actuator on the basis of a material according to the definition as set out in claim 13 is further in accordance with the invention. The use of a mixture of Pb, Nb and optionally Ag in a piezoceramic material on the basis of potassium sodium niobate (PSN) for increasing the sintering interval is also according to the invention.

A lead-free piezoceramic material on the basis of potassium sodium niobate (PSN) of the basic composition

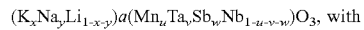

$(K_xNa_yLi_{1-x-y})a(Mn_uTa_vSb_wNb_{1-u-v-w})O_3$, with $0<x<1y$; $0<y<1$; $0<u<0.01$; $0<v<0.3$; $0≤w<0.2$ $0.95<a<1.05$; $x+y≤1$;

is assumed.

In accordance with the invention, the addition of a mixture of Pb, Nb and Ag occurs as follows:

$k$ % by weight Pb+$l$ % by weight Nb+$m$ % by weight Ag with $0<k<0.5$; $0<l<1$; $0≤m<1$.

The specifications k, l and m relate to percent by weight of the respective component relating to the total mass of the piezoceramic material.

Alternatively, Nb can be replaced entirely or partly by one or several of the elements Ta and Sb.

The piezoceramic material in accordance with the invention therefore has the following basic composition:

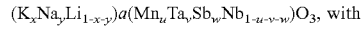

$(K_xNa_yLi_{1-x-y})a(Mn_uTa_vSb_wNb_{1-u-v-w})O_3$, with $0<x<1y$; $0<y<1$; $0<u<0.01$; $0<v<0.3$; $0≤w<0.2$ and $0.95<a<1.05$; $x+y≤1$;

and is characterized in that it contains a further component in addition to the basic composition which comprises Pb, Nb and optionally Ag, wherein the weight fractions of Pb, Nb and Ag are selected as follows relating to the total weight of the piezoceramic material:

$k$ % by weight Pb+$l$ % by weight Nb+$m$ % by weight Ag with $0<k<0.5$; $0<l<1$; $0≤m<1$.

In a preferred embodiment, the quantity of added Pb is selected in such a way that it is $0.001<k\leq0.2$.

In a further preferred embodiment, the quantity of added Nb is selected in such a way that it is $0<l\leq0.179$.

Especially good results were achieved if the ratio of added Pb to added Nb is selected in such a way that $0.001<k\leq0.2$ and $0<l\leq0.179$.

It was recognised that especially advantageous results can be achieved if the quantity of added Pb is selected in such a way that $0.001<k\leq0.1$.

It was further recognised that especially good results are achieved if the quantity of added Nb is selected in such a way that $0.022<l\leq0.09$.

The quantities of added Pb and Nb are selected especially preferably in such a way that $0.001<k\leq0.1$ and $0.022<l\leq0.09$.

Experimental examinations have further shown that the object of the invention can also be achieved when the further component additionally comprises Mn next to Pb and Nb and optionally Ag. Especially good results are achieved if the further component comprises k % by weight Pb, l % by weight Nb, and n % by weight Mn, wherein the ratio of n:l lies in the range of 0.05 to 0.15:0.30.

It has proven to be especially preferable that the ratio of Pb to Mn to Nb is selected in such a way that k:n:l lies at 1:0.09:0.30.

It was recognised that the piezoceramic materials have a sintering interval in the range of >20 K, especially in the range of 30 K to 40 K.

The piezoceramic material with reduced lead content is carried out by the steps of producing a calcinate of the basic composition and the addition of the sintering aid mixture. The addition of the sintering aid mixture, which comprises Pb, Nb and optionally Ag and optionally Mn, can occur especially during fine grinding.

The further processing is realised in the known manner, including sintering in normal atmosphere.

The invention thus also relates to a method for producing a piezoceramic material with reduced lead content, characterized by the following steps:
  producing a raw material mixture of the basic composition;
  producing a calcinate of the basic composition;
  fine grinding of the calcinate;
  producing a granulate especially by spray granulation or producing a casting slurry for the multilayer or "co-firing" process;
  further processing in the known manner, including sintering in normal atmosphere.

The "co-firing" process within the terms of the present invention shall be understood as an especially innovative production method in which films made of a piezoceramic material are cast at first and are subsequently provided with electrodes still in the green state. A piezo element is laminated from many individual films and subsequently sintered jointly with the inner electrodes in a single process step, as described for example in DE10234787C1.

A piezoceramic multilayer actuator on the basis of the piezoceramic material according to the teachings of claim 13 is according to the invention.

The invention also relates to the use of a mixture of Pb, Nb and optionally Ag in a piezoceramic material on the basis of potassium sodium niobate (PSN) of the basic composition $(K_xNa_yLi_{1-x-y})a(Mn_uTa_vSb_wNb_{1-u-v-w})O_3$, with $0<x<1$; $y$; $0<y<1$; $0<u<0.01$; $0<v<0.3$; $0\leq w<0.2$ and $0.95<a<1.05$; $x+y\leq1$;

for increasing the sintering interval of the piezoceramic material, wherein the addition of a mixture of Pb and Nb and optionally Ag occurs in such a way that the content of added Pb, Nb and Ag in percent by weight relating to the entire piezoceramic material is as follows:

k % by weight Pb+l % by weight Nb+m % by weight Ag with $0<k<0.5$; $0<l<1$; $0\leq m<1$.

In a preferred embodiment, the quantity of added Pb is selected in such a way that it is $0.001<k\leq0.2$.

In a further preferred embodiment, the quantity of added Nb is selected in such a way that $0<l\leq0.179$.

Especially good results were achieved if the ratio of added Pb to added Nb was selected in such a way that $0.001<k\leq0.2$ and $0<l\leq0.179$.

It was recognised that especially advantageous results can be achieved if the quantity of added Pb is selected in such a way that $0.001<k\leq0.1$.

It was further recognised that especially good results can be achieved if the quantity of added Nb is selected in such a way that $0.022<l\leq0.09$.

Especially preferably, the quantities of added Pb and Nb are selected in such a way that $0.001<k\leq0.1$ and $0.022<l\leq0.09$.

Experimental examinations have further shown that the object of the invention can also be achieved when the further component additionally comprises Mn next to Pb and Nb and optionally Ag. Especially good results are achieved if the further component comprises k % by weight Pb, l % by weight Nb, and n % by weight Mn, wherein the ratio of n:l lies in the range of 0.05 to 0.15:0.30.

It has proven to be especially preferable that the ratio of Pb to Mn to Nb is selected in such a way that k:n:l lies at 1:0.09:0.30.

It was surprisingly recognised by the addition of the sintering aids Pb, Nb and optionally Ag and optionally Mn that on the one hand the high insulating resistance and the strain capability of the basic composition is maintained. On the other hand, a broadening of the sintering interval is obtained to ranges between 30 K and 40 K. The addition of Pb and Nb can occur as a nominal compound in form of lead metaniobate, wherein the added quantity of the sintering aid is selected in such a way that the lead content lies in the range of 0.05% by weight to 0.2% by weight. The lead content lies at a maximum of 0.1% by weight in an especially preferred way, relating to the entire piezoceramic material.

The drawings are used for explaining the results of the examinations of different materials on the basis of PSN in accordance with the invention.

FIG. 1 describes the general technological sequence of sample production. "*" relates to such technological steps in which the described addition of Pb and Nb and optionally Ag and optionally Mn can occur.

EXAMPLES

The measurement results mentioned below relate to the basic system

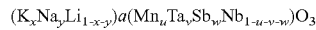
$(K_xNa_yLi_{1-x-y})a(Mn_uTa_vSb_wNb_{1-u-v-w})O_3$

The mixture of the raw materials and the fine grinding of the calcinate respectively occurred in an agitator bead mill.

The additions of Pb and Nb and optionally Mn occurred in the following technological steps:

Example 1-7: Fine Grinding

Example 8: Addition During Spray Granulation

The addition of Pb and Nb occurred in the examples 2 and 3 as an oxide mixture (M) and in the examples 4, 5 and 8 as a preformed calcinate (K). The addition of Pb, Nb and Mn occurred in the examples 6 and 7 as an oxide mixture (M).

The parameters used for the evaluation are summarised in Table 1.

| Column | Parameter |
| --- | --- |
| 1 | Addition of Pb in percent by weight |
| 2 | Addition of Nb in percent by weight |
| 3 | Addition as an oxide mixture (M) or calcinate (K) |
| 4 | Sintering temperature |
| 5 | Sintering interval |
| 6 | Dielectric constant |
| 7 | Dielectric loss factor |
| 8 | Specific insulation resistance (room temperature) |
| 9 | Specific insulation resistance (150° C.) |
| 10 | Induced strain (room temperature) |
| 11 | Sample current (room temperature) |
| 12 | Measuring field strength |
| 13 | Maximum induced strain (room temperature - 150° C.) |
| 14 | Temperature of maximum strain |
| 15 | Induced strain (150° C.) |

The specific insulation resistance $\rho_{is}$ is determined at 50 V at poled samples at temperature increase from room temperature to 150° C.

The electromechanical strain $S_3$ is determined by means of laser interferometer at 2 kV/mm. The measuring field strength is stated in column 12 for samples which as a result of increased conductivity could not be measured at 2 kV/mm.

The sintering interval shall be understood as the range bounded by two temperature specifications, within which the required properties of the ceramic are achieved during burning of the material. They are defined as follows:

tan δ: ≤50 $10^{-3}$

S3 (RT): >0.6 $10^{-3}$ $E_{max}$: ≥2 kV/mm

Figure 1:
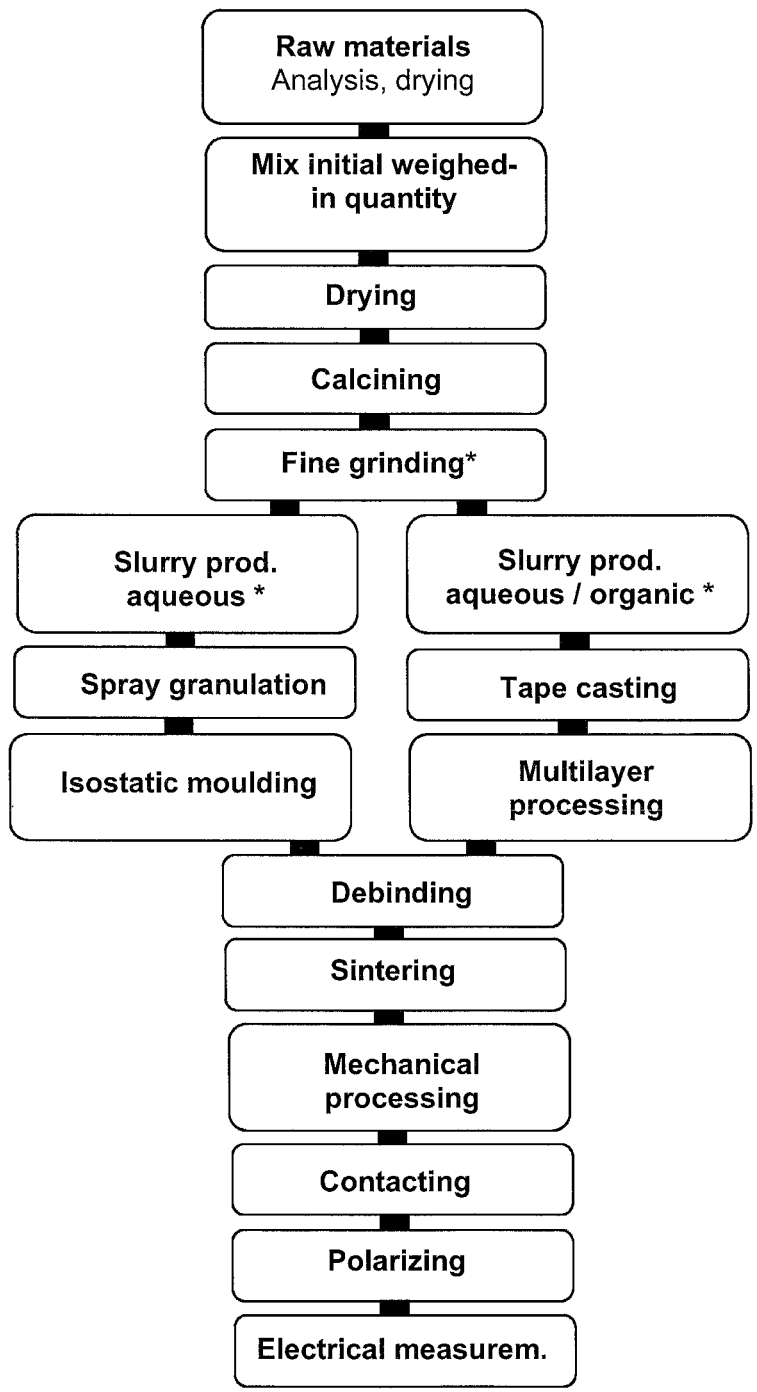
Figure 2:
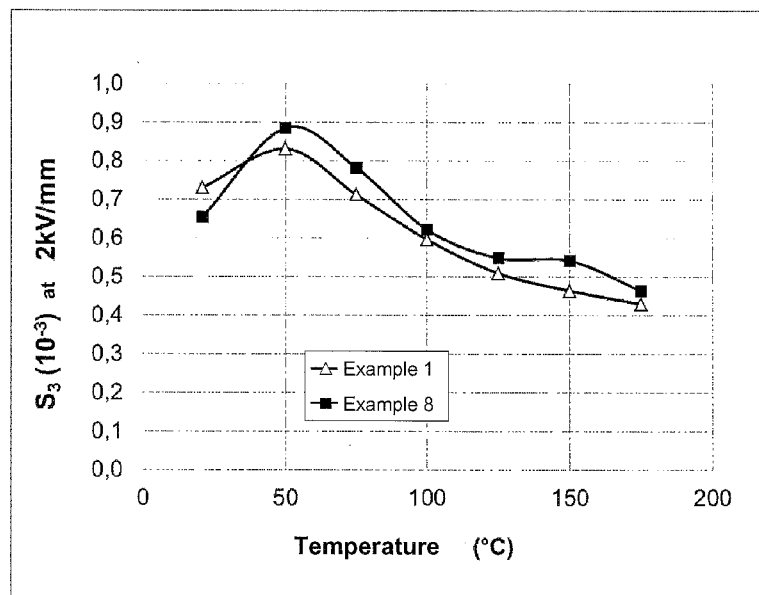
FIG. 2 shows in comparison the typical temperature dependence of the unipolar strain of the embodiments 1 (prior art) and 8 at a triggering field strength of 2 kV/mm.
Figure 3:
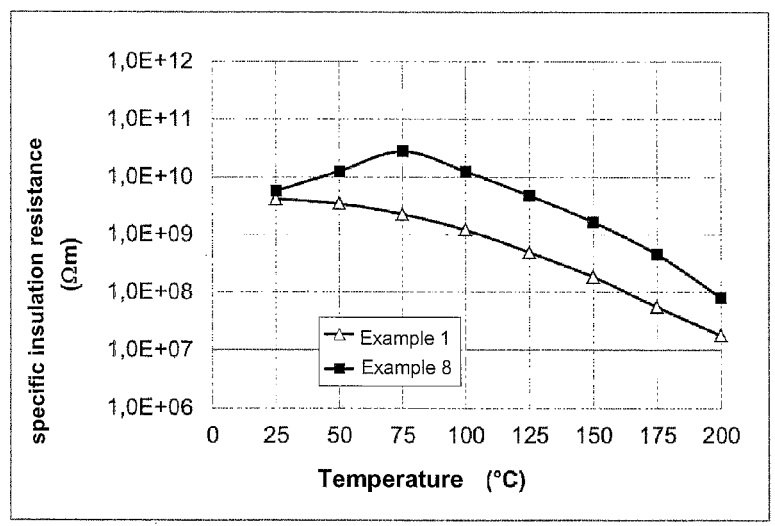
FIG. 3 shows in comparison the typical temperature dependence of the specific insulation resistance of the embodiments 1 (prior art) and 8.
Figure 4A:
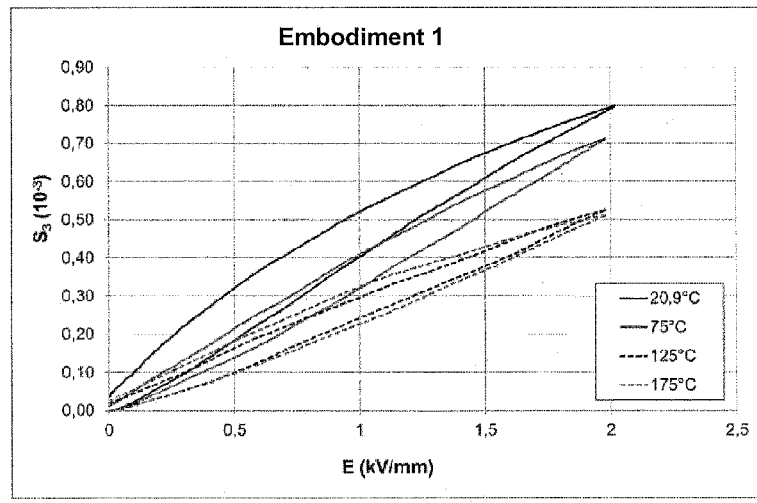
FIG. 4a shows the unipolar strain hysteresis and FIG. 4b the sample current in the temperature range of room temperature up to 175° C. for embodiment 1.
Figure 4B:
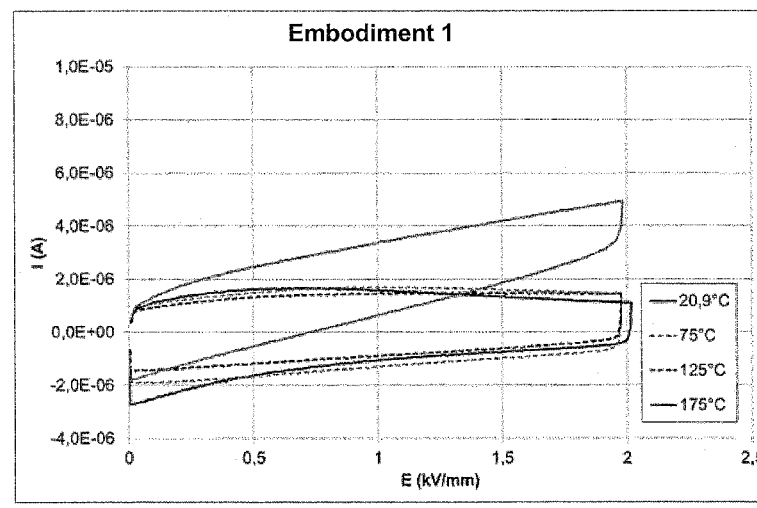
Figure 5A:
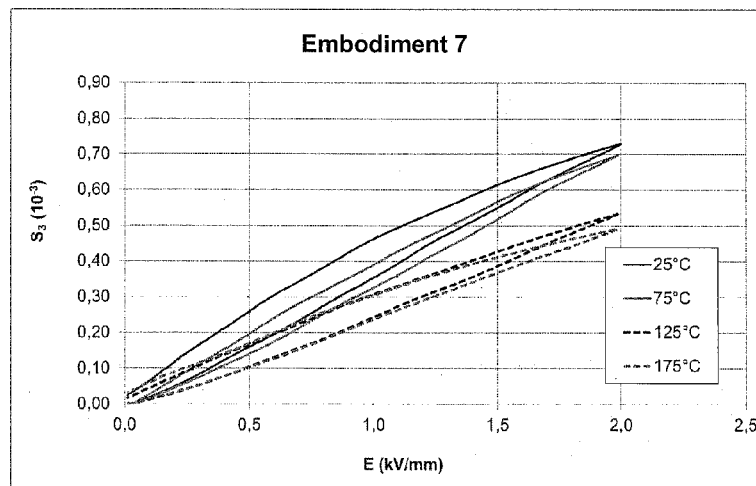
FIG. 5a shows the unipolar strain hysteresis and FIG. 5b the sample current in the temperature range of room temperature up to 175° C. for embodiment 7.
Figure 5B:
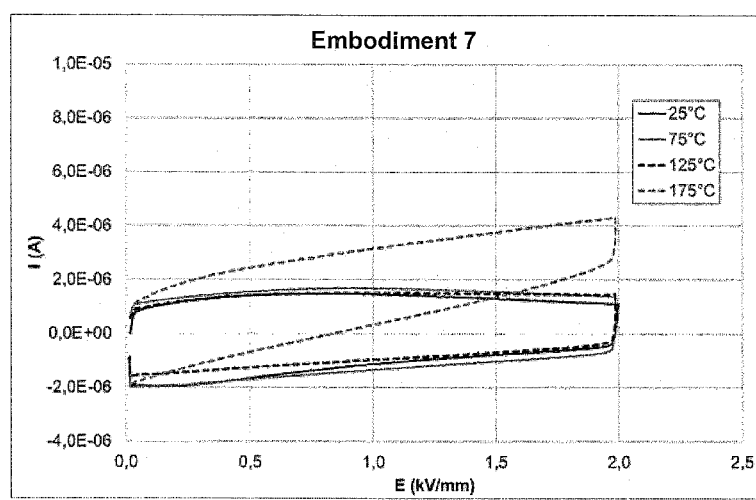
Figure 6A:
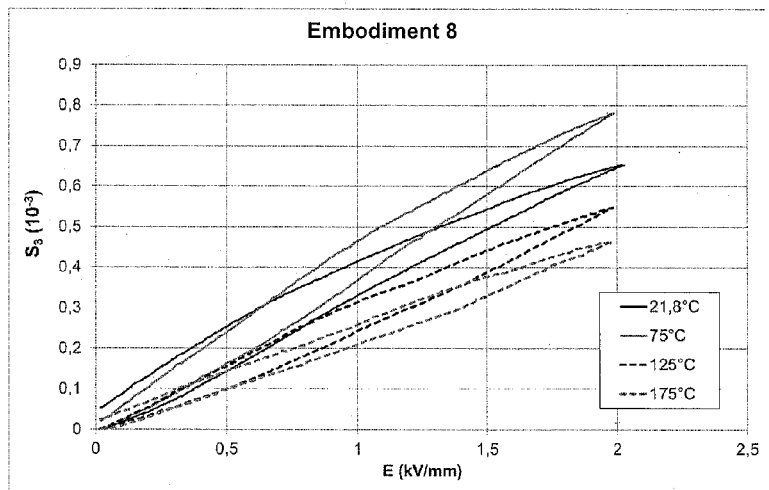
FIG. 6a shows the unipolar strain hysteresis and FIG. 6b the sample current in the temperature range of room temperature up to 175° C. for embodiment 8.
Figure 6B:
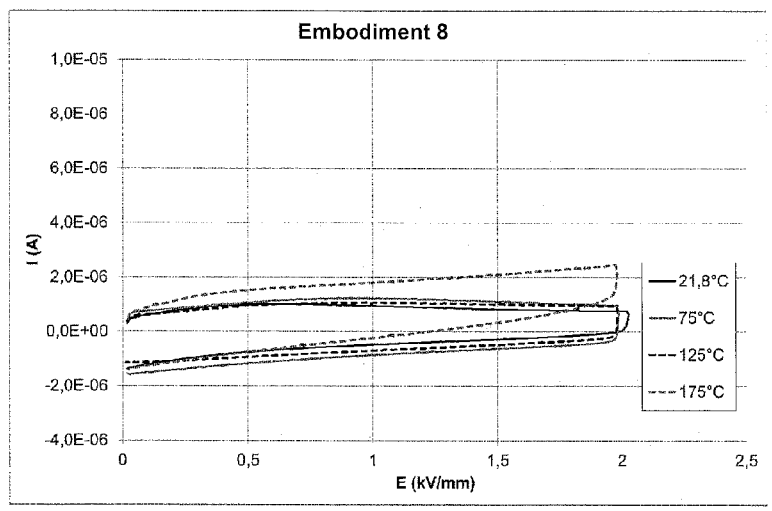

The following embodiments show the behaviour of the prior art (example 1) and the compositions produced in accordance with the invention (examples 2 to 8). The samples were produced according to the flowchart (FIG. 1).

The results of the examinations are documented in Table 2.

Embodiment 1

Composition

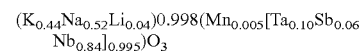
$(K_{0.44}Na_{0.52}Li_{0.04})0.998(Mn_{0.005}[Ta_{0.10}Sb_{0.06}Nb_{0.84}]_{0.995})O_3$ This composition corresponds to the prior art with a sintering interval of ≤20 K.

Embodiment 2

Composition

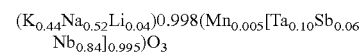
$(K_{0.44}Na_{0.52}Li_{0.04})0.998(Mn_{0.005}[Ta_{0.10}Sb_{0.06}Nb_{0.84}]_{0.995})O_3$ +0.1% by weight Pb+0.09% by weight Nb, added as an oxide mixture. This composition in accordance with the invention shows a broadening of the sintering interval to 30 K.

Embodiment 3

Composition

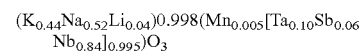
$(K_{0.44}Na_{0.52}Li_{0.04})0.998(Mn_{0.005}[Ta_{0.10}Sb_{0.06}Nb_{0.84}]_{0.995})O_3$ +0.2% by weight Pb+0.179% by weight Nb, added as an oxide mixture. This composition in accordance with the invention shows a broadening of the sintering interval to 30 K.

Embodiment 4

Composition

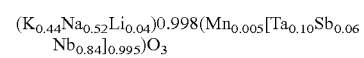
$(K_{0.44}Na_{0.52}Li_{0.04})0.998(Mn_{0.005}[Ta_{0.10}Sb_{0.06}Nb_{0.84}]_{0.995})O_3$ +0.1% by weight Pb+0.09% by weight Nb, added as a preformed calcinate. This composition in accordance with the invention shows a broadening of the sintering interval to 30 K.

Embodiment 5

Composition $(K_{0.44}Na_{0.52}Li_{0.04})0.998(Mn_{0.005}[Ta_{0.10}Sb_{0.06}Nb_{0.84}]_{0.995})O_3$ +0.2% by weight Pb+0.179% by weight Nb,
added as a preformed calcinate. This composition in accordance with the invention shows a broadening of the sintering interval to 30 K.

Embodiment 6

Composition $(K_{0.44}Na_{0.52}Li_{0.04})0.998(Mn_{0.005}[Ta_{0.10}Sb_{0.06}Nb_{0.84}]_{0.995})O_3$ +0.1% by weight Pb+0.022% by weight Nb+0.013% by weight Mn,
added as an oxide mixture. This composition shows no broadening of the sintering interval.

Embodiment 7

Composition $(K_{0.44}Na_{0.52}Li_{0.04})0.998(Mn_{0.005}[Ta_{0.10}Sb_{0.06}Nb_{0.84}]_{0.995})O_3$ +0.1% by weight Pb+0.03% by weight Nb+0.009% by weight Mn,
added as an oxide mixture. This composition in accordance with the invention shows a broadening of the sintering interval to 40 K.

Embodiment 8

Composition $(K_{0.44}Na_{0.52}Li_{0.04})0.998(Mn_{0.005}[Ta_{0.10}Sb_{0.06}Nb_{0.84}]_{0.995})O_3$ +0.1% by weight Pb+0.09% by weight Nb,
added as a preformed calcinate. This composition in accordance with the invention shows a broadening of the sintering interval to 40 K. In this embodiment, processing of the material occurred continuously on an industrial scale and the addition of Pb and Nb occurred during spray granulation.

The high insulation resistance is surprisingly maintained in the modification in accordance with the invention of the composition $(K_{0.44}Na_{0.52}Li_{0.04})0.998(Mn_{0.005}[Ta_{0.10}Sb_{0.06}Nb_{0.84}]_{0.995})O_3$ by Pb and Nb and optionally Mn.

TABLE 2

| Nr. | Addition % by wt. Pb | % by wt. Nb | | $T_{sint}$ °C. | $\Delta T_{sint}$ K | $\varepsilon^T_{33}/\varepsilon_0$ RT | $\tan\delta$ $10^{-3}$ RT | $\rho_{is}$ $\Omega m$ RT | $\rho_{is}$ $\Omega m$ 150° C. | $S_3$ $10^{-3}$ RT | I A RT | at $E_{max}$ kV/mm | $S_{3,max}$ $10^{-3}$ | T ($S_{3,max}$) °C. | $S_3$ $10^{-3}$ 150° C. |
|---|---|---|---|---|---|---|---|---|---|---|---|---|---|---|---|
| 1 | 0 | 0.000 | | 1090 | | 1210 | 41.9 | 2.8E+09 | 7.2E+07 | 0.30 | 2.3E−06 | 1.4 | | | |
| 1 | 0 | 0.000 | | 1100 | | 1340 | 40.4 | 1.6E+09 | 5.6E+07 | 0.47 | 2.4E−06 | 2.0 | | | |
| 1 | 0 | 0.000 | | 1110 | | 1300 | 19.6 | 3.5E+10 | 2.6E+08 | 0.78 | 1.7E−06 | 2.0 | 0.86 | 50 | 0.49 |
| 1 | 0 | 0.000 | | 1130 | 20 | 1170 | 26.3 | 2.8E+09 | 2.0E+08 | 0.74 | 2.1E−06 | 2.0 | | | |
| 1 | 0 | 0.000 | | 1140 | | 980 | 57.7 | 4.6E+09 | 3.3E+08 | 0.60 | 2.0E−06 | 1.5 | | | |
| 2 | 0.1 | 0.090 | M | 1100 | | 1390 | 77.1 | | | 0.34 | 2.5E−06 | 1.5 | | | |
| 2 | 0.1 | 0.090 | M | 1110 | | 1330 | 24.1 | 9.9E+09 | 1.3E+08 | 0.74 | 1.6E−06 | 2.0 | | | |
| 2 | 0.1 | 0.090 | M | 1130 | | 1270 | 36.2 | | | 0.72 | 1.6E−06 | 2.0 | | | |
| 2 | 0.1 | 0.090 | M | 1140 | 30 | 1180 | 46.2 | 4.0E+09 | 7.8E+07 | 0.67 | 2.9E−06 | 2.0 | | | |
| 2 | 0.1 | 0.090 | M | 1150 | | 1220 | 206.2 | | | | | | | | |
| 3 | 0.2 | 0.179 | M | 1100 | | 1420 | 57.4 | | | 0.53 | 2.5E−06 | 2.0 | | | |
| 3 | 0.2 | 0.179 | M | 1110 | | 1620 | 20.1 | | | 0.75 | 1.8E−06 | 2.0 | | | |
| 3 | 0.2 | 0.179 | M | 1130 | | 1350 | 24.8 | 2.3E+10 | 2.3E+08 | 0.75 | 1.6E−06 | 2.0 | 0.83 | 50 | 0.48 |
| 3 | 0.2 | 0.179 | M | 1140 | 30 | 1350 | 32.3 | | | 0.74 | 1.5E−06 | 2.0 | | | |
| 3 | 0.2 | 0.179 | M | 1150 | | 1220 | 61.6 | | | 0.46 | 6.5E−05 | 1.5 | | | |
| 4 | 0.1 | 0.090 | K | 1100 | | 1380 | 75.9 | | | 0.39 | 2.7E−06 | 1.5 | | | |
| 4 | 0.1 | 0.090 | K | 1110 | | 1420 | 24.0 | | | 0.76 | 1.7E−06 | 2.0 | | | |
| 4 | 0.1 | 0.090 | K | 1130 | | 1350 | 24.7 | 1.9E+10 | 1.5E+08 | 0.76 | 1.6E−06 | 2.0 | | | |
| 4 | 0.1 | 0.090 | K | 1140 | 30 | 1240 | 42.7 | | | 0.66 | 2.0E−05 | 2.0 | | | |
| 4 | 0.1 | 0.090 | K | 1150 | | 1290 | 186.1 | | | | | | | | |
| 5 | 0.2 | 0.179 | K | 1100 | | 1420 | 55.1 | | | 0.55 | 2.6E−06 | 2.0 | | | |
| 5 | 0.2 | 0.179 | K | 1110 | | 1450 | 19.5 | | | 0.79 | 1.7E−06 | 2.0 | | | |
| 5 | 0.2 | 0.179 | K | 1130 | | 1300 | 35.5 | 2.0E+10 | 1.6E+08 | 0.69 | 1.7E−06 | 2.0 | 0.81 | 50 | 0.49 |
| 5 | 0.2 | 0.179 | K | 1140 | 30 | 1410 | 31.2 | | | 0.72 | 1.5E−06 | 2.0 | | | |
| 5 | 0.2 | 0.179 | K | 1150 | | 1190 | 64.6 | | | 0.45 | 4.6E−05 | 1.5 | | | |
| 6 | 0.1 | 0.022 | M | 1090 | | 1480 | 31.9 | 1.7E+09 | 5.7E+07 | 0.57 | 1.9E−06 | 2.0 | | | |
| 6 | 0.1 | 0.022 | M | 1110 | | 1420 | 22.4 | 2.1E+10 | 2.0E+08 | 0.74 | 1.5E−06 | 2.0 | 0.82 | 50 | 0.50 |
| 6 | 0.1 | 0.022 | M | 1130 | 20 | 1310 | 25.6 | 5.6E+09 | 6.4E+07 | 0.72 | 2.1E−06 | 2.0 | | | |
| 6 | 0.1 | 0.022 | M | 1140 | | 1080 | 143.0 | 8.2E+08 | 5.8E+06 | | | | | | |
| 7 | 0.1 | 0.030 | M | 1090 | | 1440 | 32.5 | | | 0.61 | 2.0E−06 | 2.0 | | | |
| 7 | 0.1 | 0.030 | M | 1100 | | 1580 | 27.4 | 5.8E+09 | 1.5E+08 | 0.82 | 2.0E−06 | 2.0 | | | |
| 7 | 0.1 | 0.030 | M | 1110 | | 1570 | 22.0 | 3.7E+10 | 1.9E+08 | 0.73 | 1.7E−06 | 2.0 | 0.75 | 60 | 0.50 |
| 7 | 0.1 | 0.030 | M | 1130 | 40 | 1340 | 21.5 | 1.1E+10 | 1.2E+08 | 0.73 | 1.9E−06 | 2.0 | | | |
| 7 | 0.1 | 0.030 | M | 1140 | | 1040 | 138.0 | 6.9E+08 | 7.3E+06 | | | | | | |
| 8 | 0.1 | 0.090 | K | 1070 | | 1090 | 29.5 | 6.3E+08 | 1.7E+08 | 0.52 | 1.6E−06 | 2.0 | 0.62 | 60 | 0.41 |
| 8 | 0.1 | 0.090 | K | 1080 | | 1160 | 30.3 | 2.3E+09 | 1.3E+08 | 0.62 | 1.0E−06 | 2.0 | 0.64 | 40 | 0.49 |
| 8 | 0.1 | 0.090 | K | 1090 | | 1120 | 29.3 | 3.2E+09 | 1.8E+08 | 0.65 | 1.1E−06 | 2.0 | 0.69 | 50 | 0.49 |

TABLE 2-continued

| | Addition | | | | | tanδ | $\rho_{is}$ | $\rho_{is}$ | $S_3$ | I | | | | $S_3$ |
|---|---|---|---|---|---|---|---|---|---|---|---|---|---|---|
| Nr. | % by wt. Pb | % by wt. Nb | $T_{sint}$ °C | $\Delta T_{sint}$ K | $\varepsilon^T_{33}/\varepsilon_0$ RT | $10^{-3}$ RT | Ωm RT | Ωm 150° C. | $10^{-3}$ RT | A RT | at $E_{max}$ kV/mm | $S_{3,max}$ $10^{-3}$ | T ($S_{3,max}$) °C | $10^{-3}$ 150° C. |
| 8 | 0.1 | 0.090 | K 1100 | | 1070 | 30.1 | 2.7E+09 | 2.8E+08 | 0.61 | 1.2E-06 | 2.0 | 0.82 | 50 | 0.50 |
| 8 | 0.1 | 0.090 | K 1110 | | 1010 | 26.9 | 2.7E+09 | 1.0E+09 | 0.62 | 1.2E-06 | 2.0 | 0.78 | 60 | 0.48 |
| 8 | 0.1 | 0.090 | K 1120 | 40 | 990 | 29.4 | 8.7E+08 | 4.7E+08 | 0.65 | 1.1E-06 | 2.0 | 0.87 | 60 | 0.48 |

The invention claimed is:

1. A mixture for a piezoceramic material with reduced lead content, based on potassium sodium niobate (PSN), the mixture consisting of:
a calcinate of the basic composition $(K_xNa_yLi_{1-x-y})a(Mn_uTa_vSb_wNb_{1-u-v-w})O_3$, with $0<x<1$; $0<y<1$; $0<u<0.01$; $0<v<0.3$; $0 \leq w<0.2$ and $0.95<a<1.05$; $x+y \leq 1$; and a sintering aid mixture of Pb, Nb and optionally Ag according to $k$ % by weight Pb+$l$ % by weight Nb+$m$ % by weight Ag with $0.001<k \leq 0.2$ and $0<l \leq 0.179$; $0 \leq m<1$, characterized in that the ratio of k:l lies in the range of 1:0.9 to 1:0.3.

2. A mixture for a piezoceramic material according to claim 1, characterized in that $0.001<k \leq 0.1$.

3. A mixture for a piezoceramic material according to claim 1, characterized in that $0.022<l \leq 0.09$.

4. A mixture for a piezoceramic material according to claim 1, characterized in that $0.001<k \leq 0.1$ and $0.022<l \leq 0.09$.

5. A mixture for a piezoceramic material according to claim 1, characterized by the addition of a mixture of k % by weight Pb, l% by weight Nb, and n % by weight Mn, wherein the ratio of n:l lies in the range of 0.05 to 0.15:0.30.

6. A mixture for a piezoceramic material according to claim 5, characterized in that the ratio of k:n:l lies at 1:0.09:0.30.

7. A method for producing a piezoceramic material with reduced lead content, based on potassium sodium niobate (PSN), comprising the steps of:
producing a raw material mixture of the basic composition $(K_xNa_yLi_{1-x-y})a(Mn_uTa_vSb_wNb_{1-u-v-w})O_3$ with $0<x<1$; $0<y<1$; $0<u<0.01$; $0<v<0.3$; $0 \leq w<0.2$ and $0.95<a<1.05$; $x+y \leq 1$;

producing a calcinate of the basic composition;
adding a sintering aid mixture of Pb, Nb and optionally Ag and optionally Mn after the step of producing a calcinate of the basic composition according to $k$ % by weight Pb+$l$ % by weight Nb+$m$ % by weight Ag with $0.001<k \leq 0.2$ and $0<l \leq 0.179$; $0 \leq m<1$, characterized in that the ratio of k:l lies in the range of 1:0.9 to 1:0.3;
fine grinding of the calcinate;
producing a granulate or producing a casting slurry for the multilayer or "co-firing" process;
further processing including sintering in normal atmosphere.

8. A piezoceramic multilayer actuator on the basis of a piezoceramic material with reduced lead content, based on potassium sodium niobate (PSN), formed by a process comprising the steps of:
producing a raw material mixture of the basic composition $(K_xNa_yLi_{1-x-y})a(Mn_uTa_vSb_wNb_{1-u-v-w})O_3$, with $0<x<1$; $0<y<1$; $0<u<0.01$; $0<v<0.3$; $0 \leq w<0.2$ and $0.95<a<1.05$; $x+y \leq 1$;

producing a calcinate of the basic composition;
adding a sintering aid mixture of Pb, Nb and optionally Ag and optionally Mn after the step of producing a calcinate of the basic composition according to $k$ % by weight Pb+$l$ % by weight Nb+$m$ % by weight Ag with $0.001<k \leq 0.2$ and $0<l \leq 0.179$; $0 \leq m<1$, characterized in that the ratio of k:l lies in the range of 1:0.9 to 1:0.3;
fine grinding of the calcinate;
producing a granulate or producing a casting slurry for the multilayer or "co-firing" process;
further processing including sintering in normal atmosphere.

9. A method of increasing the sintering interval in a piezoceramic material, based on potassium sodium niobate (PSN) of the basic composition $(K_xNa_yLi_{1-x-y})a(Mn_uTa_vSb_wNb_{1-u-v-w})O_3$, with $0<x<1$; $0<y<1$; $0<u<0.01$; $0<v<0.3$; $0 \leq w<0.2$ and $0.95<a<1.05$; $x+y \leq 1$, comprising the step of adding a sintering aid mixture of Pb, Nb and Ag to the basic composition such that the content of added Pb, Nb and Ag in percent by weight relating to the entire piezoceramic material is as follows:

$k$ % by weight Pb+$l$ % by weight Nb+$m$ % by weight Ag, with $0.001<k \leq 0.2$ and $0<l \leq 0.179$; $0 \leq m<1$, characterized in that the ratio of k:l lies in the range of 1:0.9 to 1:0.3, wherein the range bounded by two temperature specifications is to be understood as the sintering interval, within which the required properties of the ceramic material are achieved during the burning of the material, which are defined as follows:

$\tan \delta$: $\leq 50 \cdot 10^{-3}$

S3 (RT): $>0.6 \cdot 10^{-3}$ $E_{max}$: $\geq 2$ kV/mm.

10. The method of increasing the sintering interval in a piezoceramic material according to claim 9, characterized in that $0.001 < k \leq 0.1$ and $0.022 < l \leq 0.09$.

11. The method of increasing the sintering interval in a piezoceramic material according to claim 10, characterized by the addition of a mixture of k % by weight Pb, 1% by weight Nb, and n % by weight Mn, wherein the ratio of n:l lies in the range of 0.05 to 0.15:0.30.

12. The method of increasing the sintering interval in a piezoceramic material according to claim 11, characterized in that the ratio of k:n:l lies at 1:0.09:0.30.

13. A method as defined by claim 7, wherein the granulate is produced by spray granulation.

\* \* \* \* \*